Dec. 16, 1958 R. F. GRANTGES ET AL 2,864,905

MODULATOR-DEMODULATOR AMPLIFIER SYSTEM

Filed Feb. 4, 1957

INVENTOR.
RICHARD F. GRANTGES
JOHANN HOLZER

BY Harry M. Saragovitz
ATTORNEY

United States Patent Office 2,864,905
Patented Dec. 16, 1958

2,864,905

MODULATOR-DEMODULATOR AMPLIFIER SYSTEM

Richard F. Grantges, Madison, and Johann Holzer, Long Branch, N. J.

Application February 4, 1957, Serial No. 638,180

6 Claims. (Cl. 179—171)

(Granted under Title 35, U. S. Code (1952), sec. 266)

The invention described herein may be manufactured and used by or for the Government for governmental purposes, without the payment of any royalty thereon.

This invention relates to amplifier systems and more particularly to a system wherein linear amplification is achieved by means of non-linear amplifiers.

Generally, amplifying devices may be classified as linear, or analog amplifiers and non-linear, or digital amplifiers. In amplifiers of the former type, the output of the amplifier is more or less a faithful reproduction of an input signal at a higher voltage or power level while in amplifiers of the latter type, the shape and amplitude of the amplifier output is more or less independent of the shape and size of the input signal. Linear amplifiers are usually inefficient as power amplifiers and high power outputs or high voltage gains are obtained at the cost of increasing non-linear distortion. Non-linear amplifiers are generally more efficient than linear amplifiers and high power outputs may be obtained with the output dependent only upon the presence or absence of an input or trigger signal.

In utilizing the non-linear properties of active devices, it is necessary to convert the signal to be amplified into a form which can be readily handled by a non-linear amplifier. Such a form would be a pulse code in which only equally shaped pulses are employed and, if the particular shape of the pulse is unimportant, then non-linear amplification of the pulses can produce no distortion of the converted signal. The problem of achieving linear amplification then becomes one of converting a signal into a pulse code and reconverting the pulse code into an amplified form of the original signal without non-linearity. By resorting to a pulse type of modulation, the non-linear distortion problem is shifted from the amplifying process to the modulation process. Although it is realized that some non-linear distortion will be inherent in the modulation process due to the fact that equally shaped pulses are necessary, the amount of this distortion is dependent upon the design of the modulator so that the distortion becomes a factor which is subject to the choice of circuit parameters only and does not depend upon the characteristics of the non-linear active devices employed. This fact constitutes a real advantage in that non-linear distortion of the amplifier can be made as small as desired by suitable circuit design independent of the active device characteristics.

One object of this invention is to provide an amplifier system which possesses the advantages of both linear and non-linear amplifiers in that high power at good efficiency is achieved.

Another object of this invention is to provide an amplifier system wherein high power and good efficiency is achieved without non-linear distortion.

Briefly, in accordance with the present invention there is provided an amplifier circuit comprising means including a first passive network characterized by a prescribed impulse response function and a non-linear active device for converting the input signal to a prescribed pulse code such that each pulse in the code is of the same shape and amplitude. Also included is a second passive network characterized by the same impulse response function as the first passive network and responsive to the pulse code for converting the pulse code into a signal having the same form as the input signal. In one preferred embodiment the non-linear active device is essentially a transistor blocking oscillator and the first and second passive networks each consist of a resistor and capacitor connected in parallel arrangement and having the same RC time constant. In this preferred embodiment the pulse code density is proportional to the sum of the input signal and the first derivative thereof.

For a better understanding of the invention together with other and further objects thereof, reference is had to the following description taken in connection with the accompanying drawings in which.

Figure 1:
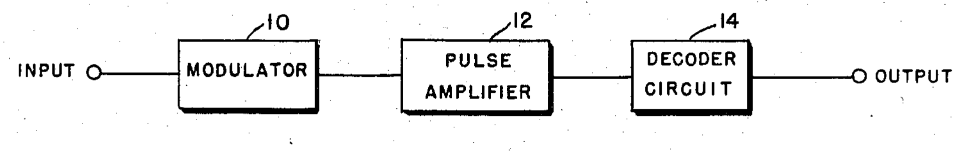
Fig. 1 is a block diagram of the present invention.
Figure 2:
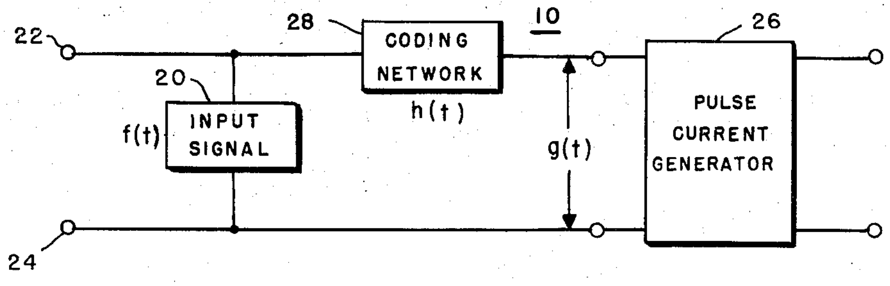
Fig. 2 is a block diagram of the modulator shown in Fig. 1.

Referring now to Figs. 1 and 2 of the drawing, there is shown an amplifier system comprising a modulator 10 for converting the input signal into a type of pulse code, a non-linear pulse amplifier 12, and a demodulator or decoder circuit 14 which reconverts the amplified pulse code into the form of the original input signal. Modulator 10 includes a pulse current generator and a coding network, which, when an input signal is applied thereto, generates a pulse code in which every pulse has the same shape and size and the pulse modulation produced is capable of being demodulated or decoded by means of a linear passive network. This latter requirement is necessary to insure that non-linearity is not introduced in the code reconversion process. The pulse conversion, or coding, circuit is shown in Fig. 2. The total input signal $f(t)$, represented by block 20, is connected across modulator input terminals 22 and 24. The input signal $f(t)$ is applied to pulse current generator 26 through the coding network 28 which is comprised of linear passive elements and is characterized by a prescribed impulse response function. Generator 26 is a non-linear active device which when rendered conductive to draw current develops an output pulse and, simultaneously, develops a signal $h(t)$ across coding network 28 in accordance with the impulse response function. The trigger signal $g(t)$ applied to generator 26 represents the difference between $f(t)$ and $h(t)$ and generator 26 is adapted to be triggered into conduction only when $g(t)=f(t)-h(t)>0$. The signal $h(t)$ is a function of both the current drawn by generator 26 when triggered into conduction and the parameters of the passive elements which comprise the coding network 28. The output of pulse generator 26 is applied through pulse amplifier 12 to demodulator 14 which comprises a network of linear passive elements having the same impulse response function characteristics as that of the coding network 28. The shape of the output pulse from modulator 10 is not important except for the requirement that each output pulse should have the same shape as every other output pulse. In terms of $g(t)$, $h(t)$ and $f(t)$, it can be seen that $f(t)=h(t)$ when $g(t)=0$, and if $g(t)=0$ is made to occur at a large number of points per cycle of the input signal, then the output from demodulator 14 will provide a signal having the same form as the original input signal.

The impedance of source $f(t)$ should be such that for a prescribed coding network and a prescribed non-linear active device, the current pulses will be of a value so as to be able to develop an $h(t)$ which will satisfy the equation of $|h(t)|$ max $\geqq|f(t)|$ max.

Figure 3:
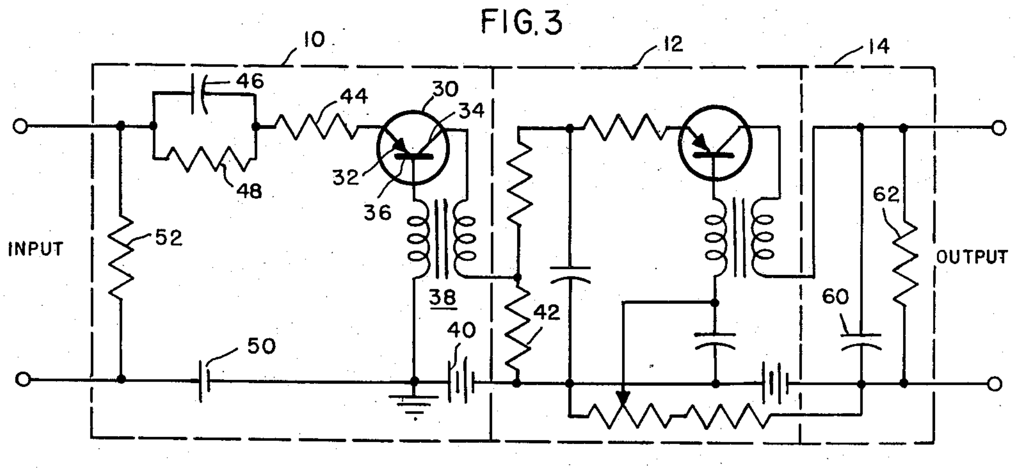
Fig. 3 is a detailed schematic diagram of a preferred embodiment of the present invention.

Fig. 3 is a detailed circuit of a preferred embodiment of the invention. Although the circuit of Fig. 3 shows a specific type of coding network, it is to be understood of course that the invention is not to be limited thereto and that other suitable coding networks may be utilized. As shown, the pulse current generator of modulator 10 includes a transistor 30 having an emitter 32, a collector 34, and a base 36. Transistor 30 may, for example, be a point-contact transistor having an N-type semi-conductive body as indicated by the accepted schematic symbol used therefor. However, it is to be understood that a point contact transistor having a P-type semi-conductive body may be used by reversing the applied voltage hereinafter described. Base electrode 36 is connected to ground through a low potential or primary winding of impedance changing transformer 38. One end of the high potential or secondary winding of transformer 38 is connected to collector 34 while the other end of the high potential winding is connected to one terminal of collector battery 40 through resistor 42. Emitter 32 is connected to one input signal terminal through resistor 44 and the parallel arrangement of capacitor 46 and resistor 48 which comprises the coding network 28. The other input signal terminal is connected to one terminal of emitter battery 50 and a resistor 52 is shown connected across the input signal terminals to represent a resistive input impedance. Battery 50 is poled to bias the emitter in the forward direction and battery 40 is poled to bias the collector in the reverse direction. Transformer 38 is connected with the polarity of its windings opposite, so that it will couple an inverted collector pulse back to the base at an impedance level comparable to the base impedance. With such an arrangement transistor 30 functions essentially as a blocking oscillator which produces a pulse when the emitter potential exceeds a certain value, hereinafter referred to as the trigger potential, which is assumed to be equal to zero volts with respect to the base.

Pulse amplifier 12 comprises a conventional transistor blocking oscillator which is adapted to produce an output pulse for every input pulse. Such an amplifier circuit is described in Felker Patent No. 2,745,012, issued May 8, 1956, and no further description thereof is believed necessary. The output from amplifier 12 is applied to demodulator circuit 14 which comprises the parallel arrangement of capacitor 60 and resistor 62 connected across the output terminals of the amplifier 12.

In discussing the operation of the amplifier system, it should be noted that it is desired to convert the input signal to a pulse code which, when applied to the linear passive network comprising parallel arranged capacitor 60 and resistor 62, will produce an output signal which is proportional to the input signal. With no input signal, modulator 10 functions as a free-running blocking oscillator. During the "on" period the collector voltage is nearly at ground, the base is held negative by pulse transformer 38, and the capacitor 46 is charged negatively by the emitter current to a voltage nearly equal to the base voltage. During the "off" period, the collector voltage is negative, the base is at ground potential and the charge level on capacitor 46 holds the emitter at a negative potential. Let it be assumed that the capacitor 46 has been charged negatively and that it is discharging through resistor 48 toward the forward bias of battery 50. Until the emitter reaches ground potential, the transistor is cutoff. When the ground potential is reached, the emitter current begins to flow and thereby releasing holes to the collector. The collector current causes the collector potential to rise and transmission through the inverting transformer 38 causes the base to fall in potential which increases the emitter current. The conducting state of the transistor will last for a duration which is determined by the stored energy in the transformer 38 and by the inner base resistance of the transistor. During the regenerative transition, the emitter current is charging capacitor 46 negatively but, as the capacitor charges, the emitter current decreases because the emitter becomes less positive with respect to the base. At the same time that the emitter current is falling, the collector current required in the transformer 38 to maintain a negative pulse at the base increases because of the time constant of the transformer. When the emitter current has fallen where it no longer releases the holes necessary to supply the demanded collector current, the base voltage rises towards ground thus causing a further decrease in the emitter current, and the transistor regeneratively cuts itself off. While the transistor is switched "on" a current pulse is generated in the circuit of collector 34 and applied to blocking oscillator amplifier 12. When the body of the transistor 30 is of P-type semi-conductive material, the polarities of batteries 40 and 50 are reversed from those used for N-type material.

Thus it can be seen that while the pulse is produced in the collector circuit of transistor 30, the emitter 32 draws a fixed amount of current which depends, for an ideal transistor, only on the parameters of the particular blocking oscillator. This amount of current drawn by the emitter puts a negative charge on capacitor 46 which results in a drop in the emitter potential. When the emitter current of pulse current generator 26 ceases, capacitor 46 discharges through resistor 48, and thus the emitter potential increases towards the voltage of the bias battery 50 in accordance with the RC time constant determined by the values of capacitor 46 and resistor 48. However, before the emitter potential reaches the value of bias battery 50, the trigger potential of the pulse current generator 26 will be exceeded thus causing it to fire or go "on." When the circuit of transistor 30 fires, the emitter 32 will again draw current and a new charge will be put on the capacitor 46. It is apparent that the interval between the firing times of the pulse current generator 26 depends only on the RC time constant of capacitor 46 and resistor 48, the forward bias voltage of battery 50, and the amount of charge placed on capacitor 46 when the emitter 32 draws current. If an input signal $S(t)$ is superimposed on the forward bias of battery 50, the time between two successive output pulses from modulator or coder 10 will vary with $S(t)$. Since only the time interval between equally shaped pulses may change, a type of pulse density modulation is obtained at the output of the modulator or coder 10. With the arrangement of the parallel RC circuit in the emitter circuit it will now be shown that the pulse density output from modulator 10 is proportional to $$\frac{1}{T}f(t)+f'(t)$$

where $f(t)$ is the total input signal composed of the forward bias from battery 50 and the input signal $S(t)$; $T$=time constant RC (resistor 48 and capacitor 46); and $f'(t)$ is the first derivative of the total input signal.

From Fig. 2 it can be seen that $$g(t)=f(t)-h(t) \qquad (1)$$

where $g(t)$=the potential on emitter 32 of modulator transistor 30

$f(t)$=the total input signal $h(t)$=the exponential discharge of capacitor 46 across resistor 48

Figure 4:
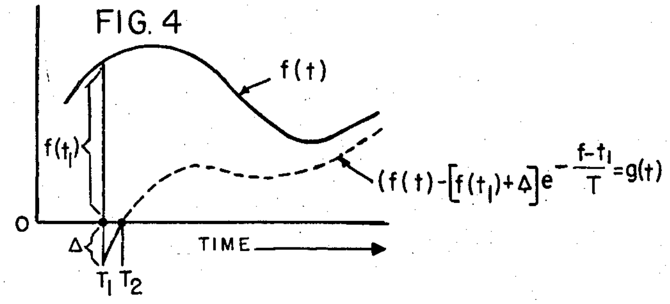
Fig. 4 is an explanatory curve to illustrate the operation of the present invention.

Now, assuming that whenever $g(t)$ equals zero, a new charge is added to capacitor 46 to produce a voltage step $\Delta$, then at a time $t_1$, (Fig. 4)

$$h(t)=[f(t_1)+\Delta]\epsilon^{-\frac{t-t_1}{T}} \qquad (2)$$

and substituting the value of $h(t)$ from Equation 1 we have $$g(t)=f(t)-[f(t_1)+\Delta]\epsilon^{-\frac{t-t_1}{T}} \quad (3)$$

At time $t_2$, when $g(t)=0$ we have $$f(t_2)-[f(t_1)+\Delta]\epsilon^{-\frac{t_2-t_1}{T}}=0 \quad (4)$$

Now multiplying Equation 4 by exp.

$$\frac{t_2}{T}$$

and rearranging, the result is $$f(t_2)\epsilon^{\frac{t_2}{T}}-f(t_1)\epsilon^{\frac{t_1}{T}}=\Delta\epsilon^{\frac{t_1}{T}} \quad (5)$$

Since the left hand side of Equation 5 appears to be the solution of a definite integral, Equation 5 can be rewritten as follows:

$$\int_{t_1}^{t_2}\frac{d}{dt}\left[f(t)\epsilon^{\frac{t}{T}}\right]dt=\Delta\epsilon^{\frac{t_1}{T}} \quad (6)$$

If both sides of Equation 6 are now divided by the length of the interval of integration, $t_2-t_1$, and the indicated differentiation is performed we have $$\epsilon^{\frac{t_1}{T}}\frac{\Delta}{t_2-t_1}=\frac{1}{t_2-t_1}\int_{t_1}^{t_2}\left[f'(t)+\frac{1}{T}f(t)\right]\epsilon^{\frac{t}{T}}dt \quad (7)$$

Now, dividing both sides of Equation 7 by exp.

$$\frac{t_1}{T}$$

and recognizing that the right hand side of Equation 7 represents the average value of the integral within the interval, there is obtained $$\frac{\Delta}{t_2-t_1}=\epsilon^{-\frac{t_1}{T}}\overline{\left[(f'(t)+f(t))\epsilon^{\frac{t}{T}}\right]}\Bigg|_{t_1}^{t_2} \quad (8)$$

It can be seen that the left side of Equation 8 represents a factor proportional to the pulse density. Hence, if we take the limit as $\Delta$ approaches zero and $t_2$ approaches $t_1=t$, we obtain $$\underset{\Delta\to 0}{\text{Limit}}\ \frac{\Delta}{t_2-t_1}=f'(t)+\frac{1}{T}f(t)=\text{pulse density} \quad (9)$$

which shows that, in the limit, the pulse density is proportional to the total input signal $f(t)$ plus its first derivative $f'(t)$.

For a parallel RC network as shown in the output demodulator circuit, the well known differential equation for current is $$I(t)=I'+RC\frac{dI'}{dt} \quad (10)$$

where $I(t)$=input current
$I'$=current through load resistor 62
$\frac{dI'}{dt}$=derivitive of $I'$ and
$RC$=time constant of network Since the output of a blocking oscillator supplies current pulses, it is to be assumed that $I(t)$ is proportional to the pulse density. Hence, substituting the value of pulse density from Equation 9 we have $$I(t)=KT\left[f'(t)+\frac{1}{T}f(t)\right] \quad (11)$$

From Equation 10, the solution of $I'$ can be written in the usual form as $$I'=\frac{1}{T}\epsilon^{-\frac{t}{T}}\int_{-\infty}^{t}I(t)\epsilon^{\frac{t}{T}}dt \quad (12)$$

Substituting the value of $I(t)$ from Equation 11 in Equation 12 we have $$I'=K\epsilon^{-\frac{t}{T}}\int_{-\infty}^{t}\left[f'(t)+\frac{1}{T}f(t)\right]\epsilon^{\frac{t}{T}}dt=Kf(t) \quad (13)$$

which clearly shows that the current through resistor 62 is proportional to $f(t)$ if the pulses density of the code applied to it is as shown in Equation 9.

While there has been described what is at present considered to be the preferred embodiment of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. An amplifier comprising, a source of input signal, means including a first passive network characterized by a prescribed impulse response function and a non-linear active device for converting said input signal to a prescribed pulse code such that each pulse in the code is of the same shape and amplitude, and a second passive network characterized by said prescribed impulse response function and responsive to said pulse code for converting said pulse code into a signal having the same form as said input signal.

2. An amplifier comprising, a source of input signal $f(t)$, means including a first parallel circuit arrangement of a resistor and capacitor characterized by prescribed RC time constant and a non-linear active device whereby said input signal is converted into a pulse code such that the pulse density thereof is proportional to $$\frac{1}{RC}f(t)+f'(t)$$

where $f'(t)$ is the first derivative of the input signal $f(t)$, each pulse in the code being of the same shape and amplitude, and a second parallel circuit arrangement of a resistor and capacitor characterized by said prescribed time constant and responsive to said pulse code for converting the pulse code into a signal having the same form as said input signal.

3. An amplifier comprising, a source of input signal, a non-linear active device including means for producing discrete output pulses having the same shape and amplitude when triggered into conduction by discrete prescribed amplitude signals applied to the input circuit of said non-linear device, said input circuit drawing a prescribed current for the duration of each of said output pulses, a first passive network characterized by a prescribed impulse function and responsive to said prescribed drawn currents and said input signal for producing the input trigger signals at a rate such that said input signal is converted into a prescribed pulse code at the output of said non-linear device, each pulse in the code being of the same shape and amplitude, and a second passive network characterized by said impulse function and responsive to said pulse code for converting the pulse code into a signal having the same form as said input signal.

4. An amplifier comprising $f(t)$; a source of input signal; a non-linear active device including a transistor having an emitter electrode, a base electrode, and a collector electrode, and means for regeneratively coupling the output of said collector electrode to said base electrode whereby when a pulse is generated in the collector circuit, said emitter electrode draws a given amount of current; a first passive network characterized by a prescribed RC time constant and responsive to said input signal and said drawn emitter current for producing in said collector circuit a pulse code such that the pulse density thereof is proportional to $$\frac{1}{RC}f(t)+f'(t)$$

where $f'(t)$ is the first derivative of said input signal $f(t)$, each pulse in the code being of the same shape and amplitude; and a second passive network characterized by said RC time constant and responsive to said pulse code for converting said pulse code into a signal having the same form as said input signal.

5. The amplifier in accordance with claim 4 wherein said first and second passive networks each comprise a parallel circuit arrangement of a resistor and capacitor.

6. An amplifier comprising; a source of input signal; means for converting said input signal to a prescribed pulse code such that each pulse therein is of the same shape and amplitude comprising a transistor having an emitter electrode, a collector electrode and a base electrode, a first passive network characterized by a prescribed impulse response function and connected between said emitter electrode and said input signal source, a transformer having its primary winding in circuit with said base electrode and its secondary winding in circuit with said collector electrode, the windings of said transformer being arranged to invert the pulse coupled back from said collector electrode to said base electrode, means for biasing said emitter electrode in the forward direction and said collector in the reverse direction; and a second passive network characterized by said prescribed impulse response function and responsive to said prescribed pulse code for converting said pulse code into a signal having the same form as said input signal.

References Cited in the file of this patent

UNITED STATES PATENTS

| | | |
|---|---|---|
| 2,343,745 | Case | Mar. 7, 1944 |
| 2,567,896 | Semm | Sept. 11, 1951 |